United States Patent
Asada

(10) Patent No.: US 9,673,775 B2
(45) Date of Patent: Jun. 6, 2017

(54) CIRCUIT SUBSTRATE AND BRANCH CIRCUIT INCLUDING HIGH PASS FILTER AND LOW PASS FILTER WITH MOUNTING PORTIONS ON SUBSTRATE BODY

(71) Applicant: Murata Manufacturing Co., Ltd., Nagaokakyo-shi, Kyoto-fu (JP)

(72) Inventor: Satoshi Asada, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 14/698,997

(22) Filed: Apr. 29, 2015

(65) Prior Publication Data

US 2015/0318835 A1 Nov. 5, 2015

(30) Foreign Application Priority Data

May 2, 2014 (JP) ................................ 2014-095194

(51) Int. Cl.
*H01P 5/12* (2006.01)
*H03H 7/46* (2006.01)
(Continued)

(52) U.S. Cl.
CPC ........... *H03H 7/463* (2013.01); *H01P 1/2135* (2013.01); *H03H 7/0138* (2013.01); *H03H 7/38* (2013.01)

(58) Field of Classification Search
CPC ........ H03H 7/463; H03H 7/0138; H03H 7/38; H01P 1/2135

(Continued)

(56) References Cited

U.S. PATENT DOCUMENTS 5,548,255 A  8/1996 Spielman
2004/0155734 A1  8/2004 Kosemura et al.
(Continued)

FOREIGN PATENT DOCUMENTS

JP  2002-300082 A  10/2002
JP  2003-264348 A  9/2003
(Continued)

OTHER PUBLICATIONS

Official Communication issued in corresponding Japanese Patent Application No. 2014-095194, mailed on Feb. 9, 2016.

*Primary Examiner* — Robert Pascal
*Assistant Examiner* — Kimberly Glenn
(74) *Attorney, Agent, or Firm* — Keating & Bennett, LLP

(57) ABSTRACT

A circuit substrate includes a substrate body, an input signal line conductor with which the substrate body is provided and included in an input path, a first mounting portion provided on a main surface of the substrate body, included in a first output path and on which a high-pass filter including a lumped-parameter element is mounted, at least one first output signal line conductor with which the substrate body is provided and included in the first output path, and a second mounting portion provided on the main surface of the substrate body, included in a second output path and on which a low-pass filter including a lumped-parameter element is mounted. The first output signal line conductor provided farthest upstream in a signal propagation direction is connected to the input signal line conductor via a first lumped-parameter element mounted on the main surface of the substrate body.

20 Claims, 19 Drawing Sheets

(51) Int. Cl.
*H03H 7/01* (2006.01)
*H03H 7/38* (2006.01)
*H01P 1/213* (2006.01)

(58) Field of Classification Search
USPC .................................... 333/126, 132, 185
See application file for complete search history.

(56) References Cited

U.S. PATENT DOCUMENTS

2012/0212305 A1* 8/2012 Shafer .................. H03H 7/0153
 333/174
2014/0354372 A1* 12/2014 Zuo ........................ H03H 7/463
 333/132

FOREIGN PATENT DOCUMENTS

| JP | 2005-323064 A | 11/2005 |
| JP | 2010-45563 A | 2/2010 |

* cited by examiner

CIRCUIT SUBSTRATE AND BRANCH CIRCUIT INCLUDING HIGH PASS FILTER AND LOW PASS FILTER WITH MOUNTING PORTIONS ON SUBSTRATE BODY

BACKGROUND OF THE INVENTION

1. Field of the Invention

The present invention relates to a circuit substrate and more specifically relates to a circuit substrate preferably for use in a branch circuit including a high pass filter and a low pass filter. In addition, the present invention relates to a branch circuit including the circuit substrate.

2. Description of the Related Art

As an example of an invention relating to a circuit substrate of the related art, the splitter described in Japanese Unexamined Patent Application Publication No. 2005-323064 is known. FIG. 19 illustrates a splitter 100 described in Japanese Unexamined Patent Application Publication No. 2005-323064.

The splitter 100 includes first to third ports P1 to P3 and a high pass filter hpf and a low pass filter lpf. The first port P1 is an input port, and the second port P2 and the third port P3 are output ports. A signal path connected to the first port P1 branches and is connected to the second port P2 and the third port P3. In addition, the high pass filter hpf is provided between the first port P1 and the second port P2, and the low pass filter lpf is provided between the first port P1 and the third port P3.

In the splitter 100 described in Japanese Unexamined Patent Application Publication No. 2005-323064, the high pass filter hpf and the low pass filter lpf preferably include conductor layers provided in a circuit substrate of the splitter 100 and chip components provided on a surface of the circuit substrate. The port P1 and the high pass filter hpf are connected to each other by a signal line composed of a conductor layer provided in the circuit substrate. Since an unwanted inductor component is generated in such a signal line, impedance matching between the first port P1 and the second port P2 is disrupted. As a result, reflection of a signal occurs between the first port P1 and the second port P2 and loss occurs in the splitter 100.

SUMMARY OF THE INVENTION

Accordingly, preferred embodiments of the present invention provide a circuit substrate and a branch circuit that significantly reduce or prevent generation of loss.

A circuit substrate according to a preferred embodiment of the present invention preferably is configured to be used in a branch circuit that includes an input path, a first output path including a high pass filter and connected to the input path, and a second output path including a low pass filter and connected to the input path. The circuit substrate includes a substrate body; an input signal line conductor with which the substrate body is provided and which is included in the input path; a first mounting portion provided on a main surface of the substrate body, included in the first output path and on which the high pass filter including a lumped-parameter element is mounted; at least one first output signal line conductor with which the substrate body is provided and which is included in the first output path; and a second mounting portion provided on the main surface of the substrate body, included in the second output path and on which the low pass filter including a lumped-parameter element is mounted. The first output signal line conductor provided farthest upstream in a propagation direction of a signal is connected to the input signal line conductor via a first lumped-parameter element mounted on the main surface of the substrate body.

A branch circuit according to another preferred embodiment of the present invention includes the circuit substrate; the high pass filter mounted on the first mounting portion; the low pass filter mounted on the second mounting portion; and a lumped-parameter element connecting the first output signal line conductor provided farthest upstream in a propagation direction of a signal and the input signal line conductor to each other, and mounted on the main surface of the substrate body.

According to various preferred embodiments of the present invention, generation of loss is significantly reduced or prevented.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
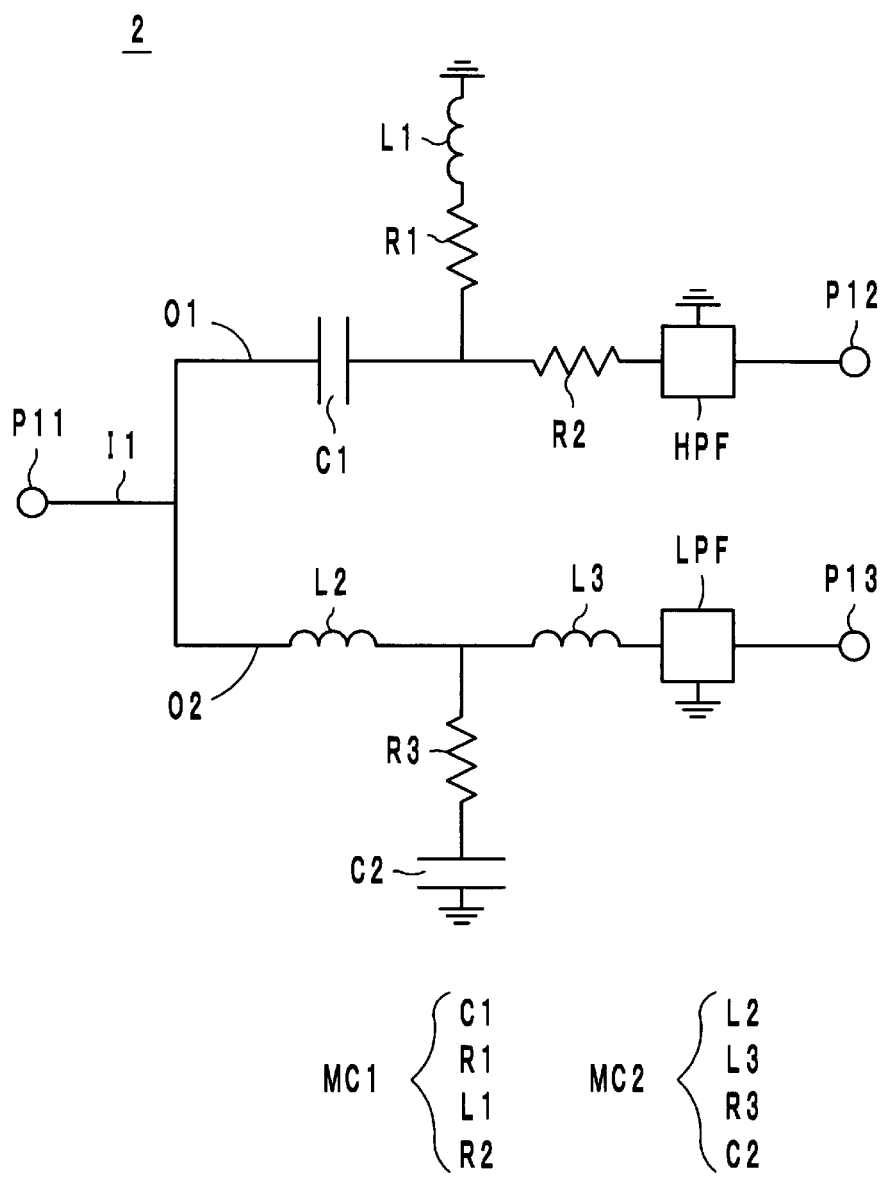
FIG. 1 is an equivalent circuit diagram of a branch circuit.
Figure 2:
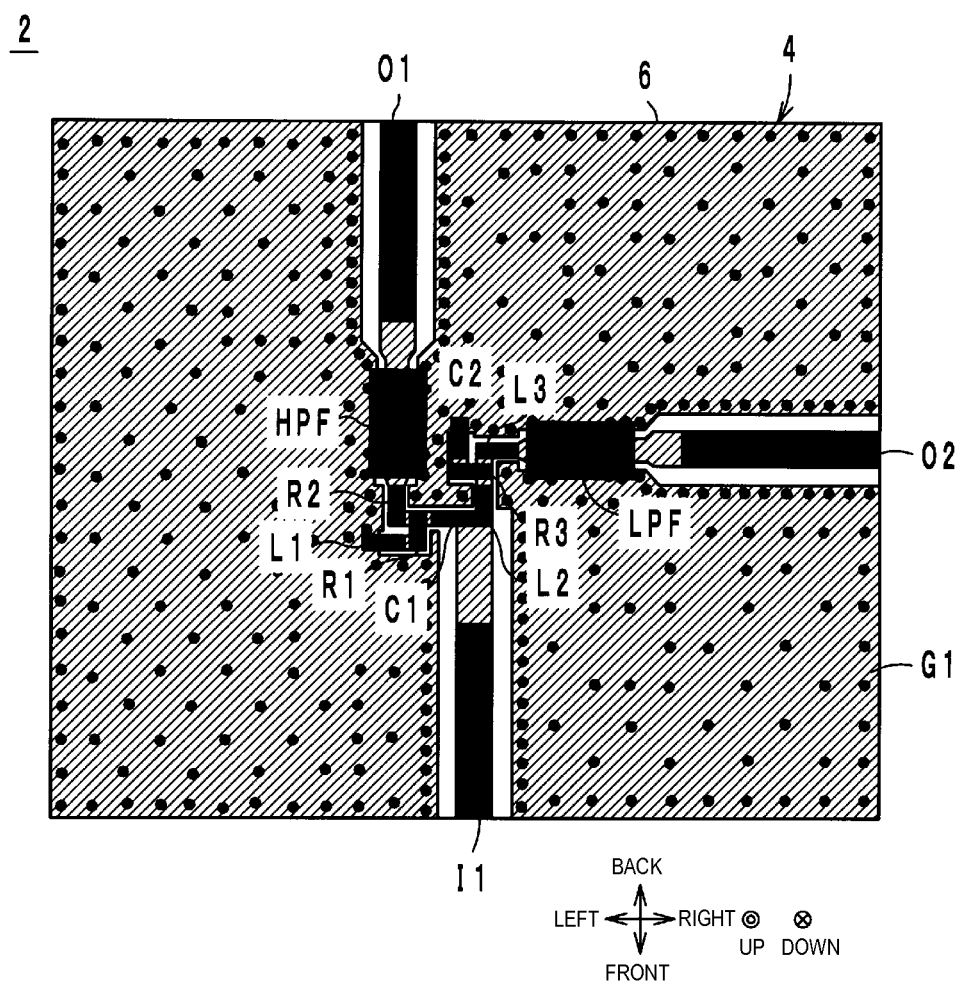
FIG. 2 is a plan view of the branch circuit from above.
Figure 3:
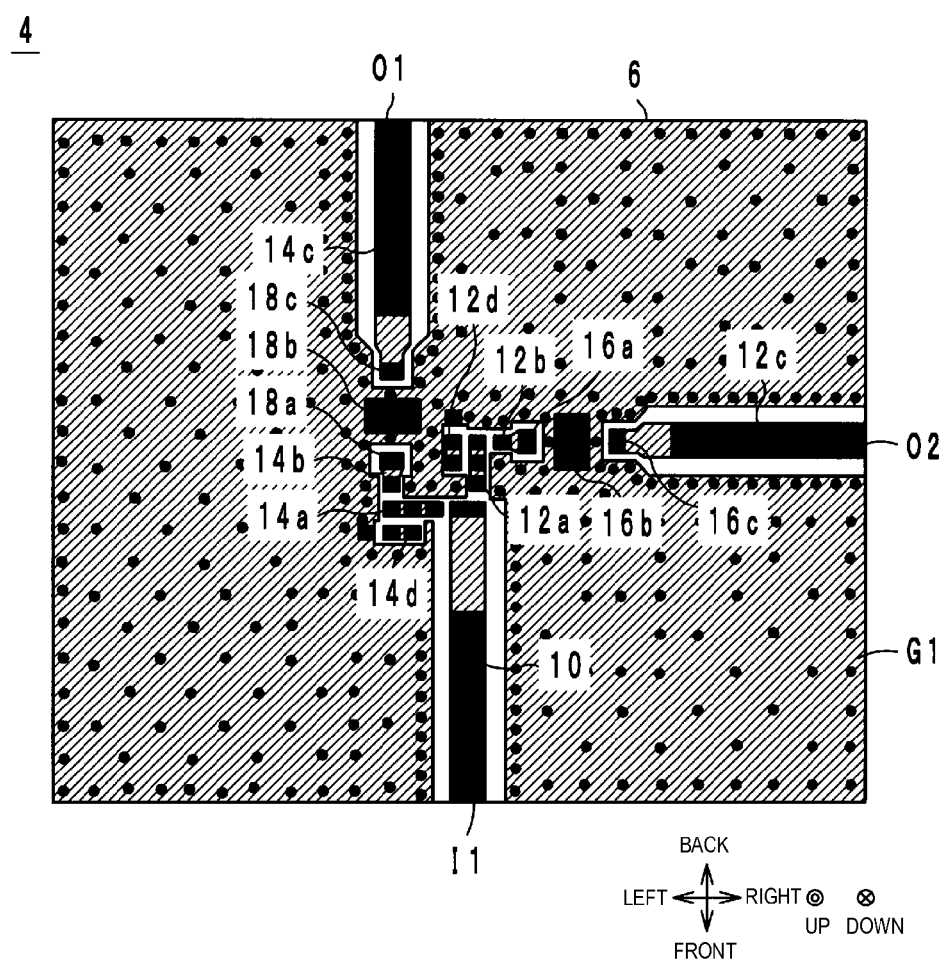
FIG. 3 is a plan view of a circuit substrate from above.
Figure 4:
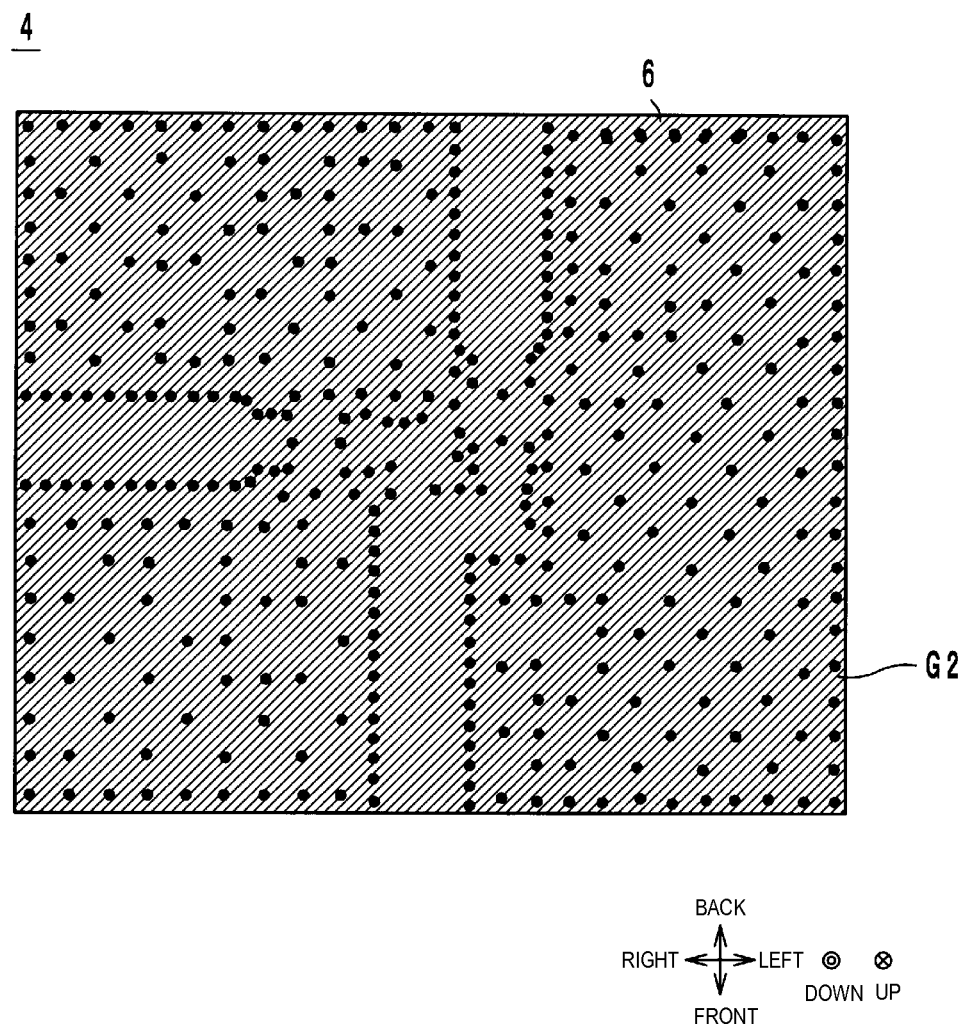
FIG. 4 is a plan view of the circuit substrate from below.

Hereafter, circuit substrates and branch circuits according to preferred embodiments of the present invention will be described while referring to the drawings. FIG. 1 is an equivalent circuit diagram of a branch circuit 2. FIG. 2 is a plan view of the branch circuit 2 from above. FIG. 3 is a plan view of a circuit substrate 4 from above. FIG. 4 is a plan view of the circuit substrate 4 from below. In FIGS. 2 to 4, a direction normal to a main surface of the circuit substrate 4 is defined as an up-down direction. In addition, when the circuit substrate 4 is viewed in plan from above, a direction in which its long edges extend is defined as a left-right direction and a direction in which its short edges extend is defined as a front-back direction.

First, a circuit configuration of the branch circuit 2 will be described while referring to FIG. 1. The branch circuit 2 preferably has a circuit configuration including an input port P11, output ports P12 and P13, an input path I1, and output paths O1 and O2. The input port P11 is a terminal though which a high-frequency signal is input. The output port P12 is a terminal through which a high-frequency signal having a relatively high frequency out of the high-frequency signal input from the input port P11 is output. The output port P13 is a terminal through which a high-frequency signal having a relatively low frequency out of the high-frequency signal input from the input port P11 is output. Therefore, a high-frequency signal is transmitted from the input port P11 to the output ports P12 and P13. Hereafter, a side located in a direction from the output ports P12 and P13 to the input port P11 will be referred to as an upstream side, and a side located in a direction from the input port P11 to the output ports P12 and P13 will be referred to as a downstream side.

An upstream-side end portion of the input path I1 is connected to the input port P11. The high-frequency signal input from the input port P11 is transmitted along the input path I1.

An upstream-side end portion of the output path O1 is connected to a downstream-side end portion of the input path I1. A downstream-side end portion of the output path O1 is connected to the output port P12. The output path O1 includes a matching circuit MC1 and a high pass filter HPF.

The matching circuit MC1 preferably includes a capacitor element C1, resistor elements R1 and R2 and an inductor element L1 and is a circuit configured to perform impedance matching. The capacitor element C1, the resistor elements R1 and R2 and the inductor element L1 preferably include lumped-parameter elements (chip components). The capacitor element C1 and the resistor element R2 are connected in series in the output path O1. In addition, the resistor element R1 and the inductor element L1 are connected in series between a portion where the capacitor element C1 and the resistor element R2 are connected to each other, and the ground.

The high pass filter HPF allows a high-frequency signal having a frequency higher than a cutoff frequency f1 to pass therethrough and preferably includes a capacitor and an inductor. The high pass filter HPF preferably includes a lumped-parameter element (chip component). The high pass filter HPF is connected downstream of the resistor element R2 and upstream of the output port P12 in the output path O1.

An upstream-side end portion of the output path O2 is connected to the downstream-side end portion of the input path I1. A downstream-side end portion of the output path O2 is connected to the output port P13. The output path O2 includes a matching circuit MC2 and a low pass filter LPF.

The matching circuit MC2 preferably includes inductor elements L2 and L3, a resistor element R3 and a capacitor element C2 and is a circuit for obtaining impedance matching. The inductor elements L2 and L3, the resistor element R3 and the capacitor element C2 preferably include lumped-parameter elements (chip components). The inductor element L2 and the inductor element L3 are connected in series in the output path O2. In addition, the resistor element R3 and the capacitor element C2 are connected in series between a portion where the inductor element L2 and the inductor element L3 are connected, and the ground.

The low pass filter LPF allows a high-frequency signal having a frequency lower than a cutoff frequency f2 to pass therethrough and preferably includes a capacitor and an inductor. The low pass filter LPF preferably includes a lumped-parameter element (chip component). The low pass filter LPF is connected downstream of the inductor element L3 and upstream of the output port P13 in the output path O2.

Next, configurations of the branch circuit 2 and the circuit substrate 4 will be described while referring to FIGS. 2 to 4. The branch circuit 2 includes the circuit substrate 4, the input port P11, the output ports P12 and P13, the input path I1, and the output paths O1 and O2. In FIGS. 2 to 4, the input port P11 and the output ports P12 and P13 are not illustrated.

The circuit substrate 4 illustrated in FIG. 3 includes a substrate body 6, signal line conductors 10, 12a to 12d and 14a to 14d, land portions 16a to 16c and 18a to 18c and ground conductors G1 and G2. The substrate body 6 preferably is a plate-shaped or substantially plate-shaped member having a rectangular or substantially rectangular shape when viewed in plan from above. Hereafter, a main surface of the substrate body 6 on the upper side will be referred to as a top surface and a main surface of the substrate body 6 on the lower side will be referred to as a bottom surface.

The ground conductors G1 and G2 are maintained at a ground potential. The ground conductor G1 covers substantially the entire top surface of the substrate body 6. The ground conductor G2 covers the entire bottom surface of the substrate body 6. The ground conductor G1 and the ground conductor G2 are connected to each other by a multiplicity of via hole conductors that penetrate through the substrate body 6 in the up-down direction.

The signal line conductor 10 is provided on the top surface of the substrate body 6 and is included in the input path I1. The ground conductor G1 is not provided around the periphery of the signal line conductor 10. In other words, the ground conductor G1 is configured so that there is a gap on the left and right sides of the signal line conductor 10. In this way, a coplanar waveguide is provided by the signal line conductor 10 and the ground conductor G1. In addition, the ground conductor G2 covers the entire bottom surface of the substrate body 6 and is therefore superposed with the signal line conductor 10 when viewed in plan from above. Thus, a coplanar waveguide including the ground is provided on the bottom surface side.

The signal line conductor 10 is a line-shaped or substantially line-shaped conductor that extends from the center of an edge of the substrate body 6 on the front side toward the back side. A back-side end portion of the signal line conductor 10 is positioned in the vicinity of the center (diagonal point of intersection) of the substrate body 6. In addition, two solder portions are provided in a line on the left and right of the back-side end portion of the signal line conductor 10 so that a chip component, which will be described later, is able to be mounted. The solder portions are formed preferably by applying solder onto the conductor and in FIG. 3 are illustrated by black shading.

The signal line conductors 12a to 12d are provided on the top surface of the substrate body 6 and are included in the output path O2. The ground conductor G1 is not provided around the peripheries of the signal line conductors 12a to 12d. In other words, the ground conductor G1 is configured so that there is a gap around the peripheries of the signal line conductors 12a to 12d. In this way, coplanar waveguides are defined by the signal line conductors 12a to 12d and the ground conductor G1. In addition, the ground conductor G2 covers the entire bottom surface of the substrate body 6 and is therefore superposed with the signal line conductors 12*a* to 12*d* when viewed in plan from above. Thus, a coplanar waveguide including the ground is provided on the bottom surface side.

The signal line conductor 12*a* is positioned behind the back-side end portion of the signal line conductor 10 and is a line-shaped or substantially line-shaped conductor that extends in the front-back direction. Solder portions are provided in three places, that is, on a front-side end portion of the signal line conductor 12*a*, on a back-side end portion of the signal line conductor 12*a* and in the center of the signal line conductor 12*a*.

The signal line conductor 12*b* is positioned to the right of the back-side end portion of the signal line conductor 12*a* and is a line-shaped or substantially line-shaped conductor that extends in the left-right direction. Solder portions preferably are provided in two places, that is, on a left-side end portion of the signal line conductor 12*b* and on a right-side end portion of the signal line conductor 12*b*. The solder portion provided on the right-side end portion of the signal line conductor 12*b* is the land portion 16*a*.

The signal line conductor 12*c* is positioned to the right of the right-side end portion of the signal line conductor 12*b* and is a line-shaped or substantially line-shaped conductor that extends in the left-right direction. A right-side end portion of the signal line conductor 12*c* is positioned in the center of an edge of the substrate body 6 on the right side. A solder portion, which is the land portion 16*c*, is provided on a left-side end portion of the signal line conductor 12*c*.

The signal line conductor 12*d* is positioned to the left of the signal line conductor 12*a* and is a line-shaped or substantially line-shaped conductor that extends in the front-back direction. Solder portions are provided in two places, that is, on a front-side end portion of the signal line conductor 12*d* and on a back-side end portion of the signal line conductor 12*d*. In addition, a solder portion is provided on the ground conductor G1 behind the back-side end portion of the signal line conductor 12*d*.

The land portion 16*b* is a solder portion provided between the right-side end portion of the signal line conductor 12*b* and the left-side end portion of the signal line conductor 12*c*. The land portion 16*b* is formed preferably by applying solder onto the ground conductor G1. The land portions 16*a* to 16*c* are provided on the top surface of the substrate body 6 and are included in the output path O2. In addition, the land portions 16*a* to 16*c* are mount portions on which the low pass filter LPF, which will be described later, is to be mounted.

The signal line conductors 14*a* to 14*d* are provided on the top surface of the substrate body 6 and are included in the output path O1. The ground conductor G1 is not provided around the peripheries of the signal line conductors 14*a* to 14*d*. In other words, the ground conductor G1 is configured so that there is a gap around the peripheries of the signal line conductors 14*a* to 14*d*. In this way, coplanar waveguides are defined by the signal line conductors 14*a* to 14*d* and the ground conductor G1. In addition, the ground conductor G2 covers the entire bottom surface of the substrate body 6 and is therefore superposed with the signal line conductors 14*a* to 14*d* when viewed in plan from above. Thus, the signal line conductors 14*a* to 14*d* and the ground conductor G2 define a microstripline structure.

The signal line conductor 14*a* is positioned to the left of the back-side end portion of the signal line conductor 10 and is a line-shaped or substantially line-shaped conductor that extends in the left-right direction. Solder portions preferably are provided in three places, that is, on a right-side end portion of the signal line conductor 14*a*, on a left-side end portion of the signal line conductor 14*a* and in the center of the signal line conductor 14*a*.

The signal line conductor 14*b* is positioned behind the left-side end portion of the signal line conductor 14*a* and is a line-shaped or substantially line-shaped conductor that extends in the front-back direction. Solder portions preferably are provided in two places, that is, on a front-side end portion of the signal line conductor 14*b* and on a back-side end portion of the signal line conductor 14*b*. The solder portion provided on the back-side end portion of the signal line conductor 14*b* is the land portion 18*a*.

The signal line conductor 14*c* is positioned behind the back-side end portion of the signal line conductor 14*b* and is a line-shaped or substantially line-shaped conductor that extends in the front-back direction. A back-side end portion of the signal line conductor 14*c* is positioned in the center of an edge of the substrate body 6 on the back side. A solder portion, which is the land portion 18*c*, is provided on a front-side end portion of the signal line conductor 14*c*.

The signal line conductor 14*d* is positioned in front of the signal line conductor 14*a* and is a line-shaped or substantially line-shaped conductor that extends in the left-right direction. Solder portions are provided in two places, that is, on a right-side end portion of the signal line conductor 14*d* and on a left-side end portion of the signal line conductor 14*d*. In addition, a solder portion is provided on the ground conductor G1 to the left of the left-side end portion of the signal line conductor 14*d*.

The land portion 18*b* is a solder portion provided between the back-side end portion of the signal line conductor 14*b* and the front-side end portion of the signal line conductor 14*c*. The land portion 18*b* is formed preferably by applying solder onto the ground conductor G1. The land portions 18*a* to 18*c* are provided on the top surface of the substrate body 6 and are included in the output path O1. In addition, the land portions 18*a* to 18*c* are mount portions on which the high pass filter HPF, which will be described later, is to be mounted.

Roughly speaking, the signal line conductors 12*a* to 12*d* extend from the center of the substrate body 6 toward the right and the signal line conductors 14*a* to 14*d* extend from the center of the substrate body 6 toward the back. Therefore, the signal line conductors 12*a* to 12*d* and the signal line conductors 14*a* to 14*d* have asymmetrical structures with respect to the signal line conductor 10.

The inductor element L2 is mounted on a right-side solder portion provided on the back-side end portion of the signal line conductor 10 and on a solder portion provided on the front-side end portion of the signal line conductor 12*a*. In other words, an upstream-side end portion (front-side end portion) of the signal line conductor 12*a* provided farthest upstream in a transmission direction of a high-frequency signal among the signal line conductors 12*a* to 12*d* is connected to the signal line conductor 10 via the inductor element L2, which is a lumped-parameter element.

The inductor element L3 is mounted on the solder portion provided on the back-side end portion of the signal line conductor 12*a* and on the solder portion provided on the left-side end portion of the signal line conductor 12*b*. The resistor element R3 is mounted on the solder portion provided in the center of the signal line conductor 12*a* and on the solder portion provided on the front side of the signal line conductor 12*d*. The capacitor element C2 is mounted on the solder portion provided on the back side of the signal line conductor 12*d* and on the solder portion provided on the ground conductor G1 behind that solder portion. The low pass filter LPF is mounted on the land portions 16a to 16c.

The capacitor element C1 is mounted on a left-side solder portion provided on the back-side end portion of the signal line conductor 10 and on a solder portion provided on the right-side end portion of the signal line conductor 14a. In other words, an upstream-side end portion of the signal line conductor 14a (right-side end portion) provided farthest upstream in a transmission direction of a high-frequency signal among the signal line conductors 14a to 14d is connected to the signal line conductor 10 via the capacitor element C1, which is a lumped-parameter element.

The resistor element R2 is mounted on the solder portion provided on the left-side end portion of the signal line conductor 14a and on a solder portion provided on the front-side end portion of the signal line conductor 14b. The resistor element R1 is mounted on the solder portion provided in the center of the signal line conductor 14a and on the solder portion provided on the right side of the signal line conductor 14d. The inductor element L1 is mounted on the solder portion provided on the left side of the signal line conductor 14d and on the solder portion provided on the ground conductor G1 to the left of that solder portion. The high pass filter HPF is mounted on the land portions 18a to 18c.

In the above-described branch circuit 2, the capacitor element C2 is arranged closer to the high pass filter HPF than to the low pass filter LPF and is connected to the ground conductor G1. Accordingly, the matching circuit MC2 is connected to the ground conductor G1 at a point closer to the high pass filter HPF than to the low pass filter LPF. That is, the matching circuit MC2 is connected to the ground conductor G1 at a position spaced apart from the low pass filter LPF.

With the thus-configured branch circuit 2 and circuit substrate 4, loss generated in the output path O1 is significantly reduced or prevented. In more detail, an upstream-side end portion of the signal line conductor 14a provided farthest upstream in a transmission direction of a high-frequency signal among the signal line conductors 14a to 14d is connected to the signal line conductor 10 via the capacitor element C1, which is a lumped-parameter element. That is, the output path O1 is connected to the signal line conductor 10 in a form not including an unnecessary line conductor, that is, not via a signal line conductor but via the capacitor element C1. Thus, a signal line conductor, which is an inductor component, does not exist between the matching circuit MC1 and the signal line conductor 10. Therefore, disruption of impedance matching between the input port P11 and the output port P12 is prevented and loss generated in the output path O1 is significantly reduced or prevented.

In addition, with the thus-configured branch circuit 2 and circuit substrate 4, loss generated in the output path O2 is significantly reduced or prevented. In more detail, an upstream-side end portion of the signal line conductor 12a provided farthest upstream in a transmission direction of a high-frequency signal among the signal line conductors 12a to 12d is connected to the signal line conductor 10 via the inductor element L2, which is a lumped-parameter element. That is, the output path O2 is connected to the signal line conductor 10 not via a signal line conductor but via the inductor element L2. Thus, a signal line conductor, which is an inductor component, does not exist between the matching circuit MC2 and the signal line conductor 10. Therefore, disruption of impedance matching between the input port P11 and the output port P13 is prevented and loss generated in the output path O2 is significantly reduced or prevented.

In addition, with the branch circuit 2 and the circuit substrate 4, the matching circuit MC2 is connected to the ground conductor G1 at a point closer to the high pass filter HPF than to the low pass filter LPF. Thus, as is clear from experimental results and simulation results to be described later, two attenuation poles are generated in a frequency band higher than the cutoff frequency f2 of the low pass filter LPF in a high-frequency signal output from the output port P13. Therefore, the band of the output path O2 is widened.

In addition, with the branch circuit 2 and the circuit substrate 4, the signal line conductors 12a to 12d and the signal line conductors 14a to 14d have asymmetrical structures with respect to the signal line conductor 10. Thus, the degree of freedom as regards the layout of the arrangement of the signal line conductors 12a to 12d and 14a to 14d is increased.

In addition, coplanar waveguides are defined by the signal line conductors 10, 12a to 12d and 14a to 14d and the ground conductor G1. Furthermore, the signal line conductors 10, 12a to 12d and 14a to 14d and the ground conductor G2 define coplanar waveguides including a ground on the bottom surface. Thus, the characteristic impedances of the signal line conductors 10, 12a to 12d and 14a to 14d preferably are made to match predetermined values (for example, about 50Ω and about 75Ω).

Figure 5:
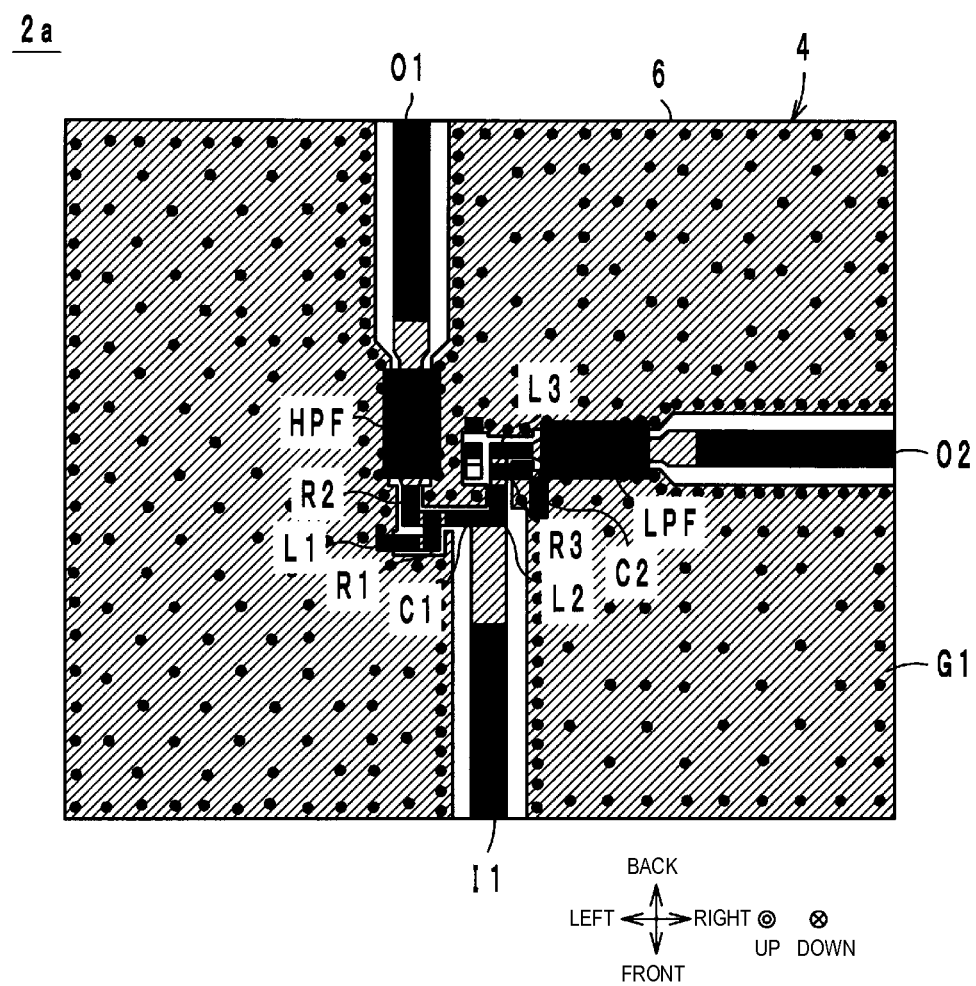
FIG. 5 is a plan view of a branch circuit according to a modification from above.

The inventors of various preferred embodiments of the present application carried out the experiments described below in order to make the broadening of a frequency range that is attenuated in the output path O2 in the branch circuit 2 and the circuit substrate 4 clearer. FIG. 5 is a plan view of a branch circuit 2a according to a modification to one of the preferred embodiments of the present invention described above. In the branch circuit 2a illustrated in FIG. 5, the capacitor element C2 is arranged closer to the low pass filter LPF than to the high pass filter HPF and is connected to the ground G1. Accordingly, the matching circuit MC2 is connected to the ground conductor G1 at a point closer to the low pass filter LPF than to the high pass filter HPF.

Figure 6:
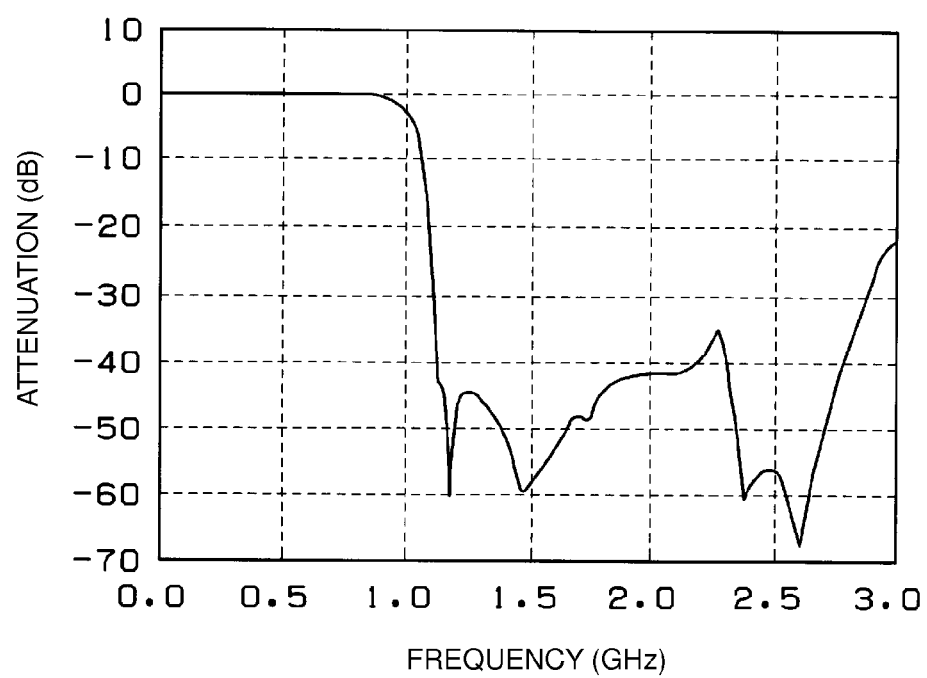
FIG. 6 is a graph illustrating a transmission characteristic |S21| in a first sample.
Figure 7:
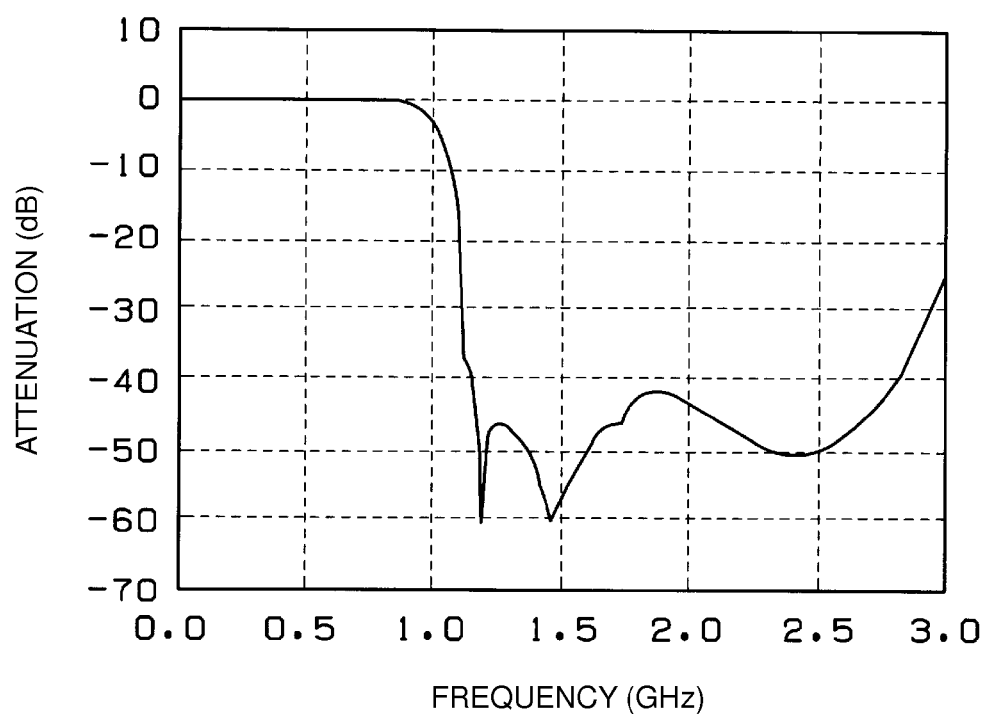
FIG. 7 is a graph illustrating a transmission characteristic |S21| in a second sample.

The inventors of various preferred embodiments of the present application fabricated a first sample of the branch circuit 2 illustrated in FIG. 2 and a second sample of the branch circuit 2a illustrated in FIG. 5. An S parameter was measured for the first sample and the second sample. FIG. 6 is a graph illustrating a transmission characteristic S21 for the first sample. FIG. 7 is a graph illustrating a transmission characteristic S21 for the second sample. The transmission characteristic S21 is a parameter representing the ratio of the strength of a high-frequency signal output from the output port P13 to the strength of a signal input from the input port P11.

The cutoff frequency f2 of the low pass filter LPF of the first sample and the second sample is around 1.1 GHz. According to FIG. 7, no attenuation poles are generated in the second sample around 2.5 GHz, which is a frequency higher than the cutoff frequency f2. On the other hand, according to FIG. 6, two attenuation poles are generated in the first sample around 2.5 GHz, which is a frequency higher than the cutoff frequency f2. Thus, in the first sample, it is clear that large attenuation is obtained in a frequency band higher than the cutoff frequency f2 and that broadening of a frequency range that is attenuated is achieved.

Figure 8:
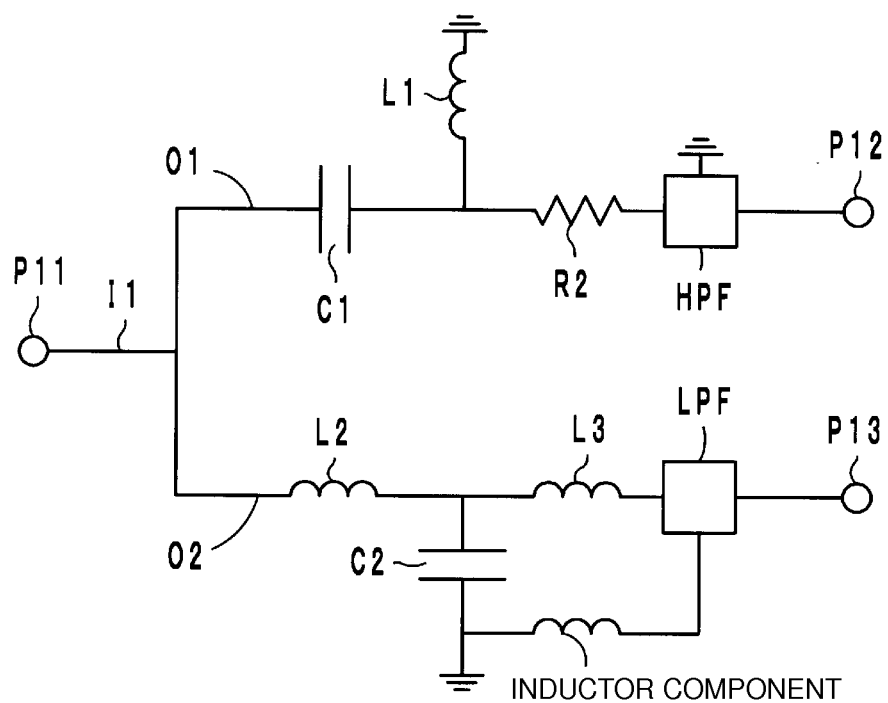
FIG. 8 is an equivalent circuit diagram of a first model corresponding to the first sample.
Figure 9:
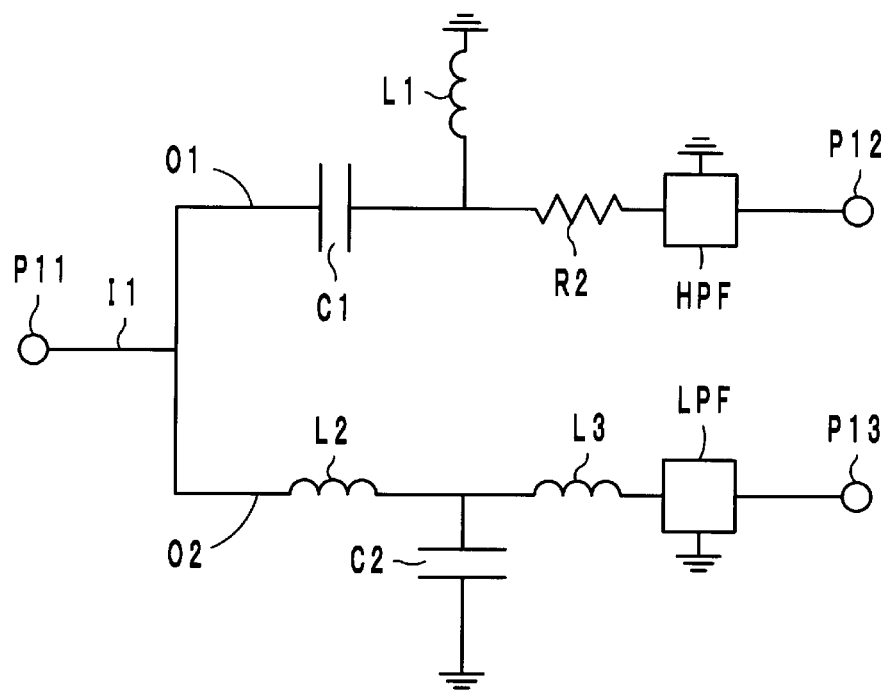
FIG. 9 is an equivalent circuit diagram of a second model corresponding to the second sample.

Next, the inventors of various preferred embodiments of the present application performed the computer simulation described below in order to make the cause of the broadening of the frequency range that is attenuated in the branch circuit 2 and the circuit substrate 4 clearer. FIG. 8 is an equivalent circuit diagram of a first model corresponding to the first sample. FIG. 9 is an equivalent circuit diagram of a second model corresponding to the second sample.

The first model is different from the second model in that an inductor component is provided between the low pass filter LPF and the ground. Hereafter, the reason for providing the inductor component between the low pass filter LPF and the ground in the first model will be described.

In the branch circuit 2a (corresponding to the second sample and second model) illustrated in FIG. 5, the solder portion with which the capacitor element C2 and the ground conductor G1 are connected to each other and the solder portion (land 16b) with which the low pass filter LPF and the ground conductor G1 are connected to each other are relatively close to each other. Consequently, almost no inductor component is generated along a current path from the solder portion with which the capacitor element C2 and the ground conductor G1 are connected to each other and the solder portion with which the low pass filter LPF and the ground conductor G1 are connected to each other. Therefore, in the second model illustrated in FIG. 9, an inductor component is not provided between the low pass filter LPF and the ground.

On the other hand, in the branch circuit 2 (corresponding to the first sample and first model) illustrated in FIG. 2, the solder portion with which the capacitor element C2 and the ground conductor G1 are connected to each other and the solder portion with which the low pass filter LPF and the ground conductor G1 are connected to each other (land 16b) are relatively far apart. Consequently, an inductor component is generated along the current path from the solder portion with which the capacitor element C2 and the ground conductor G1 are connected to each other to the solder portion with which the low pass filter LPF and the ground conductor G1 are connected to each other. Therefore, in the first model, an inductor component is provided between the low pass filter LPF and the ground.

Figure 10:
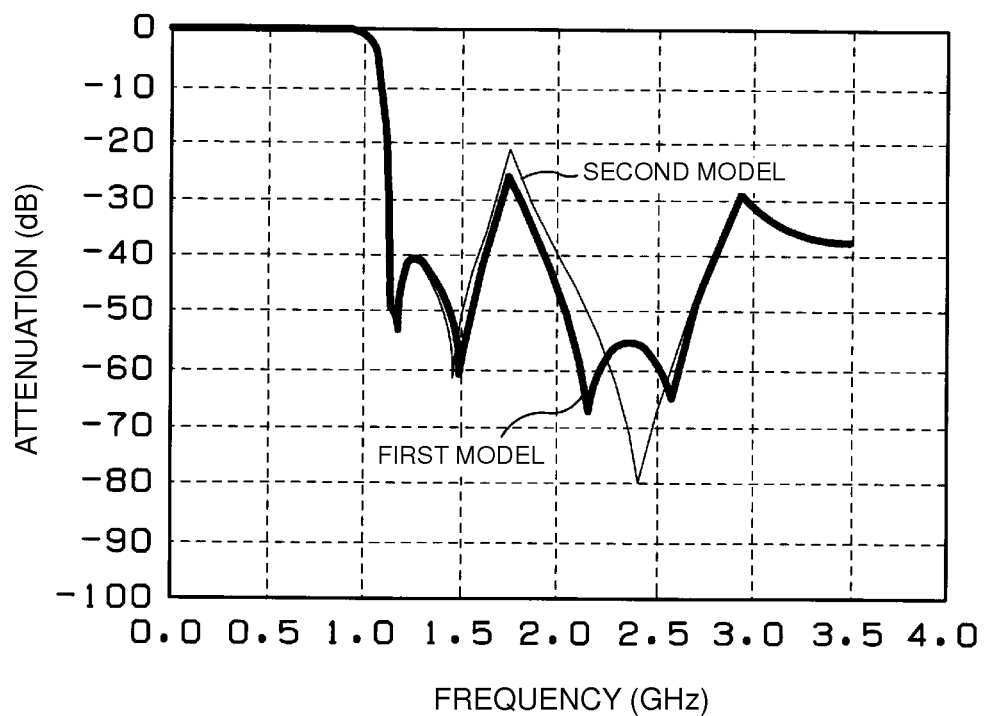
FIG. 10 is a graph illustrating a transmission characteristic |S21| of the first model and the second model.

An S parameter is calculated in the above-described first model and second model. FIG. 10 is a graph illustrating a transmission characteristic S21 of the first model and the second model.

According to FIG. 10, one attenuation pole is generated in the second model around 2.5 GHz, which is a frequency higher than the cutoff frequency f2. On the other hand, according to FIG. 10, two attenuation poles are generated in the first model around 2.5 GHz, which is a frequency higher than the cutoff frequency f2, similarly to as in the first sample. Therefore, it is clear that two attenuation poles are generated because the solder portion with which the capacitor element C2 and the ground conductor G1 are connected to each other and the solder portion with which the low pass filter LPF and the ground conductor G1 are connected to each other (land portion 16b) are spaced relatively far apart from each other as in the first model. Thus, it is clear that large attenuation is obtained in a frequency band higher than the cutoff frequency f2 and that broadening of a frequency range that is attenuated is achieved.

Figure 11:
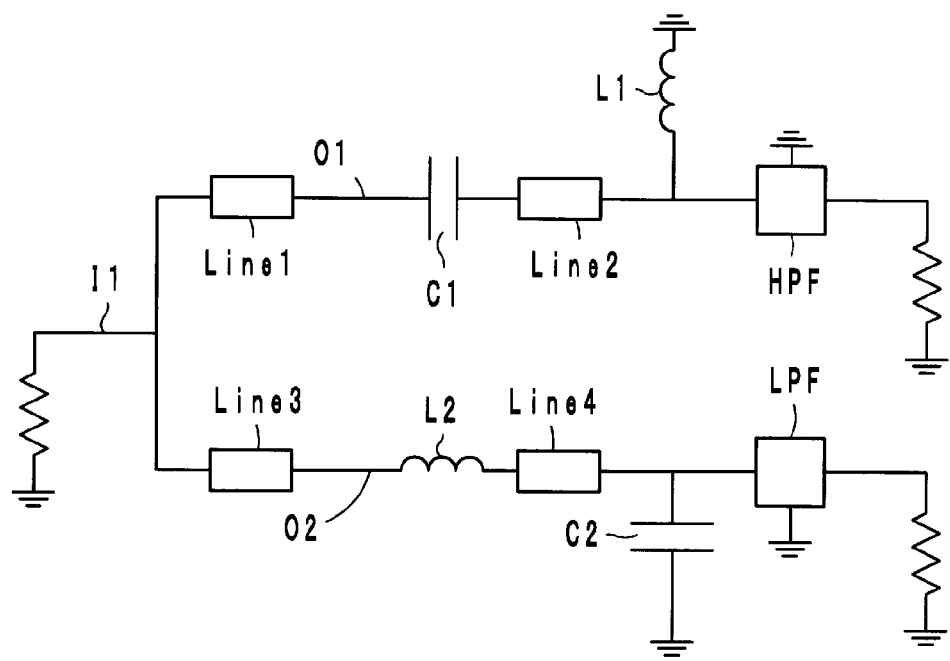
FIG. 11 is an equivalent circuit diagram of a model used in a computer simulation.

Next, the inventors of various preferred embodiments of the present application performed the computer simulation described below in order to make is clearer why loss generated in the output path O1 in the branch circuit 2 and the circuit substrate 4 is reduced. FIG. 11 is an equivalent circuit diagram of a model used in a computer simulation.

In the model illustrated in FIG. 11, wiring lines Line1 and Line2 were respectively arranged upstream and downstream of the capacitor element C1 and wiring lines Line3 and Line4 were respectively arranged upstream and downstream of the inductor element L2. Wiring lines Line1 to Line4 preferably include signal line conductors. The lengths of the wiring lines Line1 to Line4 were changed and then the S parameter was calculated for each model.

Third Model: length of wiring line Line1 2 mm, length of wiring line Line2 2 mm, length of wiring line Line3 2 mm, length of wiring line Line4 2 mm Fourth Model: length of wiring line Line1 0 mm, length of wiring line Line2 4 mm, length of wiring line Line3 2 mm, length of wiring line Line4 around 2 mm Fifth Model: length of wiring line Line1 0 mm, length of wiring line Line2 4 mm, length of wiring line Line3 0 mm, length of wiring line Line4 4 mm In addition, hereafter, conditions common to the third to fifth models will be described.

Capacitance of capacitor element C1: 1.8 pF
Inductance of inductor element L1: 10 nH
Inductance of inductor element L2: 15 nH
Capacitance of capacitor element C2: 3.0 pF The third model corresponds to a comparative example. In the third model, signal line conductors (wiring lines Line1 and Line3) exist between the input path I1 and the matching circuit MC1 of the output path O1 and between the input path I1 and the matching circuit MC2 of the output path O2.

The fourth model corresponds to a preferred embodiment of the present invention. In the fourth model, a signal line conductor (wiring line Line1) does not exist between the input path I1 and the matching circuit MC1 of the output path O1 and a signal line conductor (wiring line Line3) does exist between the input path I1 and the matching circuit MC2 of the output path O2.

In other words, in the fourth model, the signal line conductor that exists between the input path I1 and the matching circuit MC1 of the output path O1 in the third model (wiring line Line1) is shifted to the signal line conductor downstream of the capacitor element C1 (wiring line Line2).

The fifth model corresponds to a preferred embodiment of the present invention. In the fifth model, signal line conductors (wiring lines Line1 and Line3) do not exist between the input path I1 and the matching circuit MC1 of the output path O1 and between the input path I1 and the matching circuit MC2 of the output path O2. In other words, in the fifth model, the signal line conductor that exists between the input path I1 and the matching circuit MC1 of the output path O1 in the third model (wiring line Line1) is shifted to the signal line conductor downstream of the capacitor element C1 (wiring line Line2). In addition, in the fifth model, the signal line conductor that exists between the input path I1 and the matching circuit MC2 of the output path O2 in the third model (wiring line Line3) is shifted to the signal line conductor downstream of the inductor element L2 (wiring line Line4).

Figure 12:
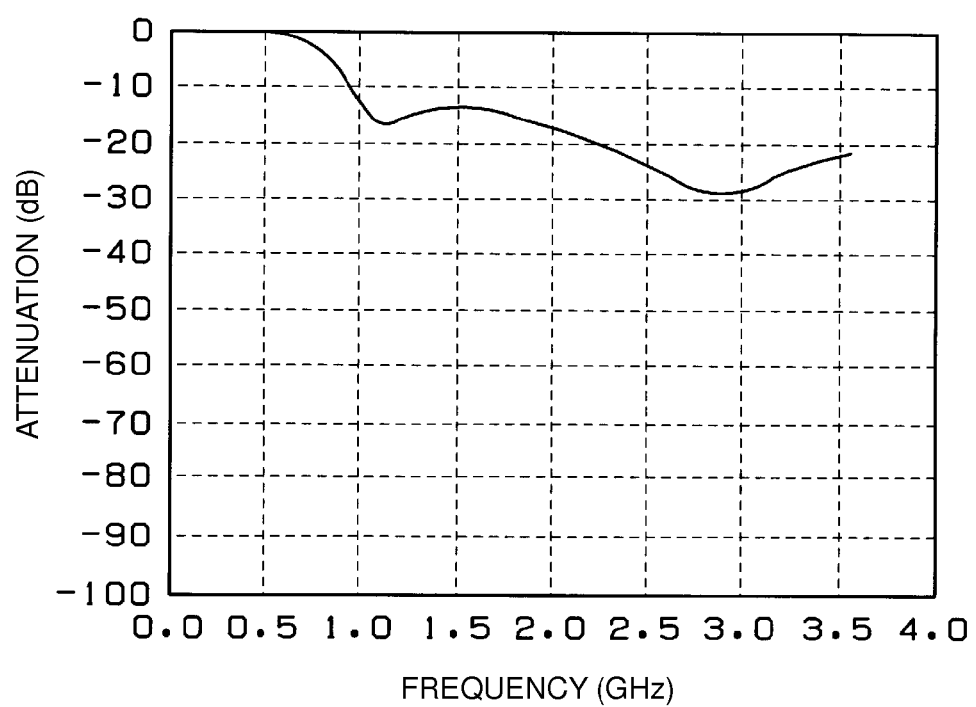
FIG. 12 is a graph illustrating a reflection characteristic |S33| in a third model.
Figure 13:
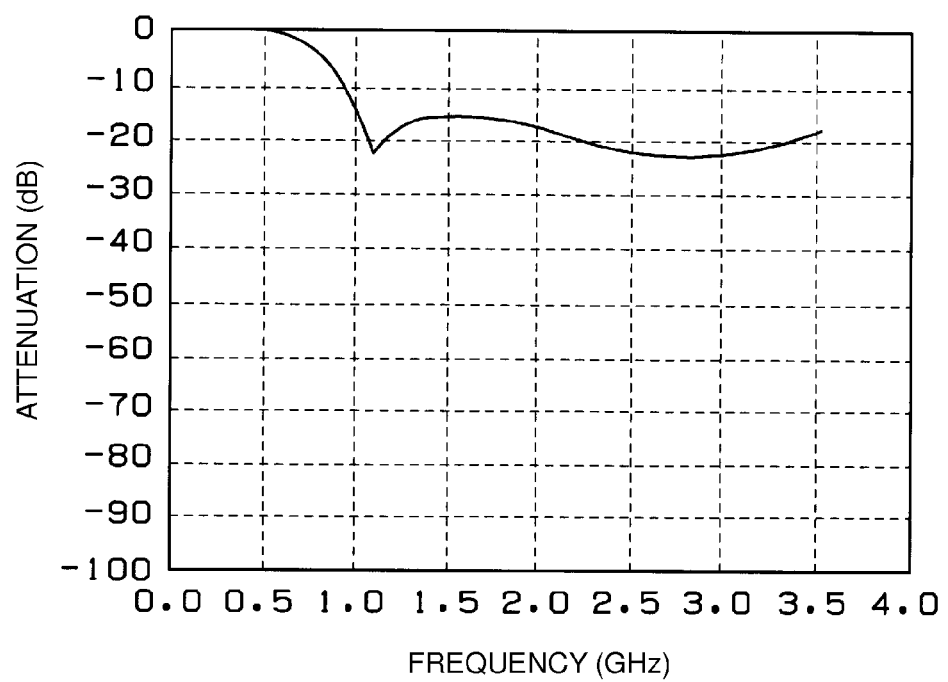
FIG. 13 is a graph illustrating a reflection characteristic |S33| in a fourth model.
Figure 14:
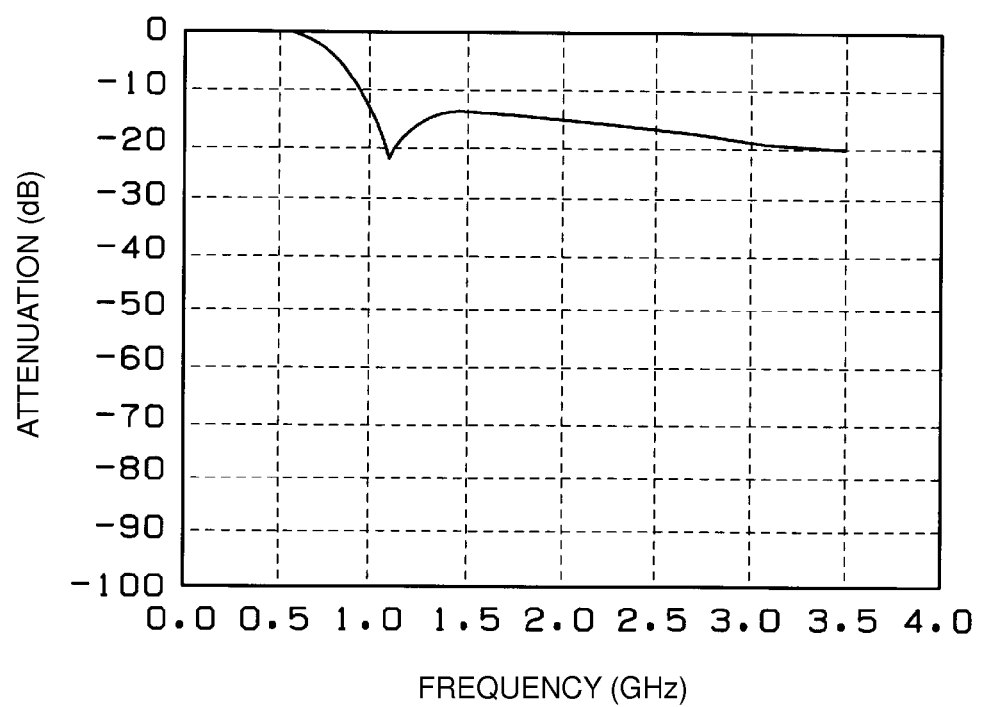
FIG. 14 is a graph illustrating a reflection characteristic |S33| in a fifth model.

The inventors of preferred embodiments of the present application calculated a reflection characteristic S33 using the third to fifth models. The reflection characteristic S33 is a parameter representing the ratio of the strength of a high-frequency signal output from the output port P12 to the strength of a signal input from the output port P12. FIG. 12 is a graph illustrating the reflection characteristic S33 in the third model. FIG. 13 is a graph illustrating the reflection characteristic S33 in the fourth model. FIG. 14 is a graph illustrating the reflection characteristic S33 in the fifth model.

Comparing FIG. 12 and FIG. 13, it is clear that the decrease in the reflection characteristic S33 around 1.1 GHz is larger in the fourth model than in the third model. Thus, the reflection characteristic S33 is improved by removing the signal line conductor from between the input path I1 and the matching circuit MC1 of the output path O1. That is, it is clear that loss generated in the output path O1 is improved.

In addition, comparing FIG. 13 and FIG. 14, it is clear that the decrease in the reflection characteristic S33 around 1.1 GHz is the same in the fourth model and the fifth model. Thus, it is clear that the cause of the large decrease in the reflection characteristic S33 around 1.1 GHz was not removal of a signal line conductor from between the input path I1 and the matching circuit MC2 of the output path O2, but rather removal of a signal line conductor from between the input path I1 and the matching circuit MC1 of the output path O1.

Figure 15:
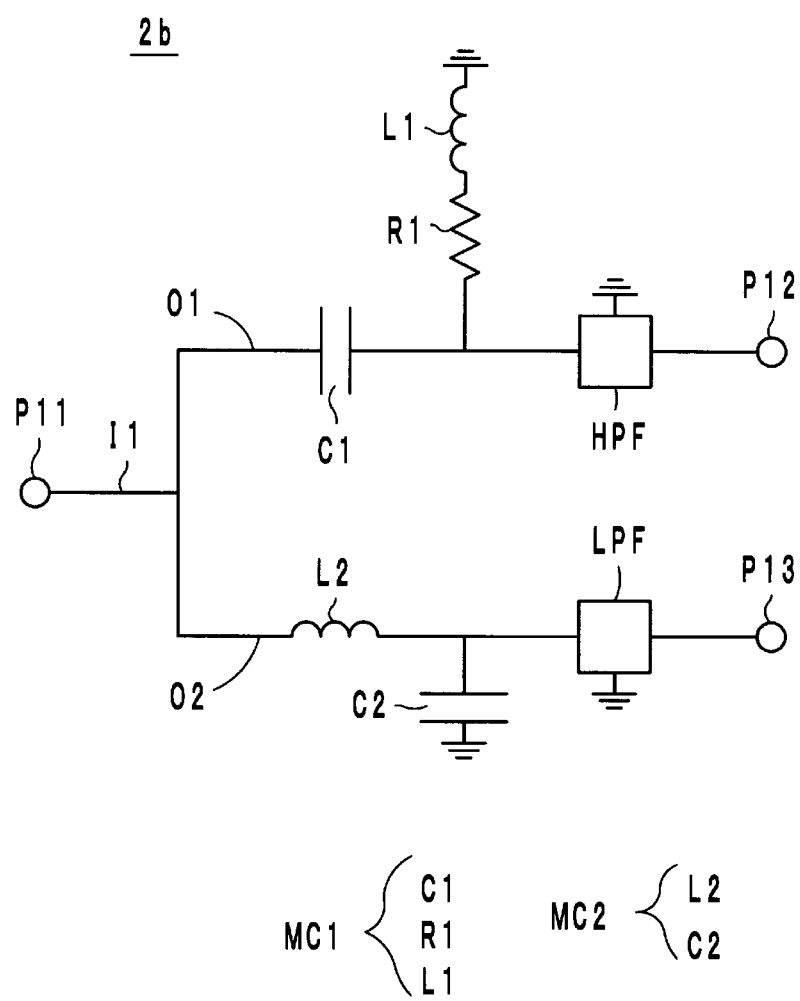
FIG. 15 is an equivalent circuit diagram of a branch circuit.
Figure 16:
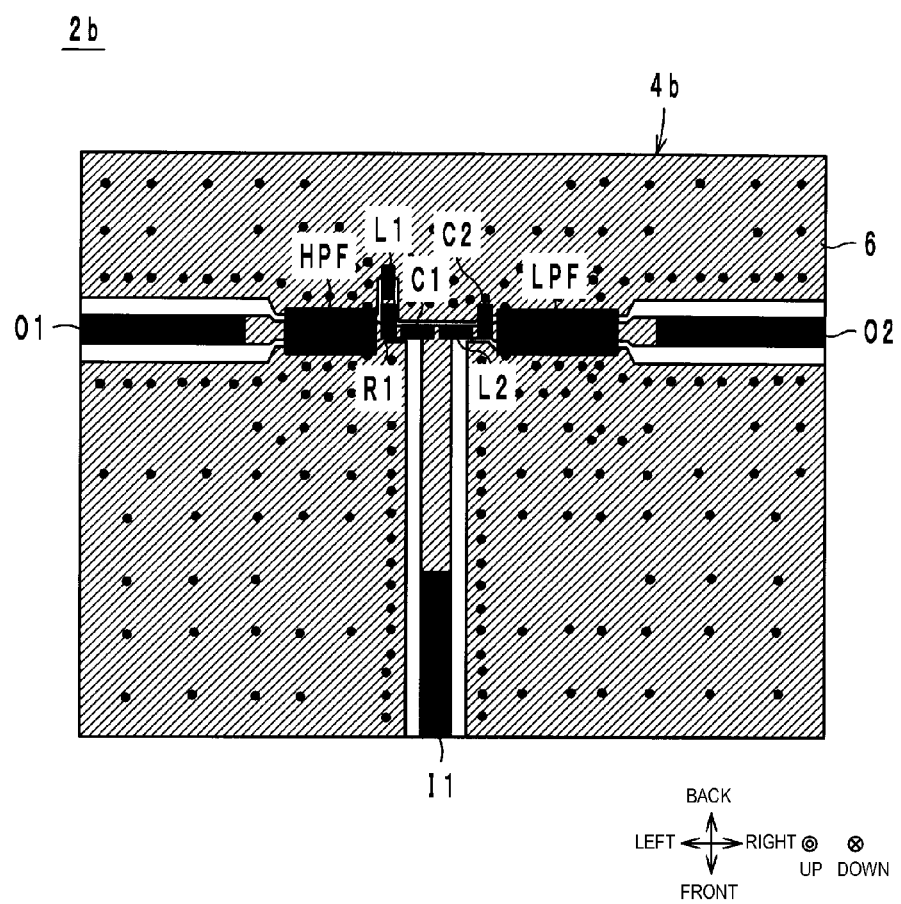
FIG. 16 is a plan view of the branch circuit from above.
Figure 17:
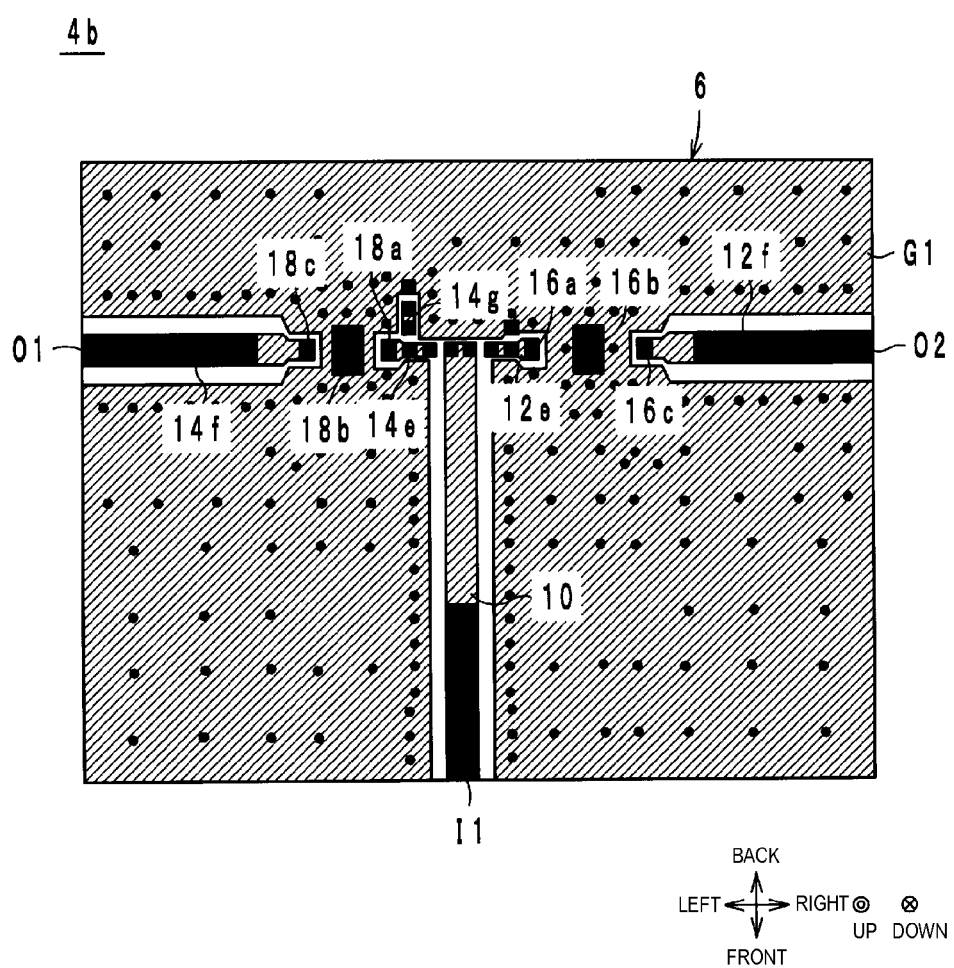
FIG. 17 is a plan view of a circuit substrate from above.
Figure 18:
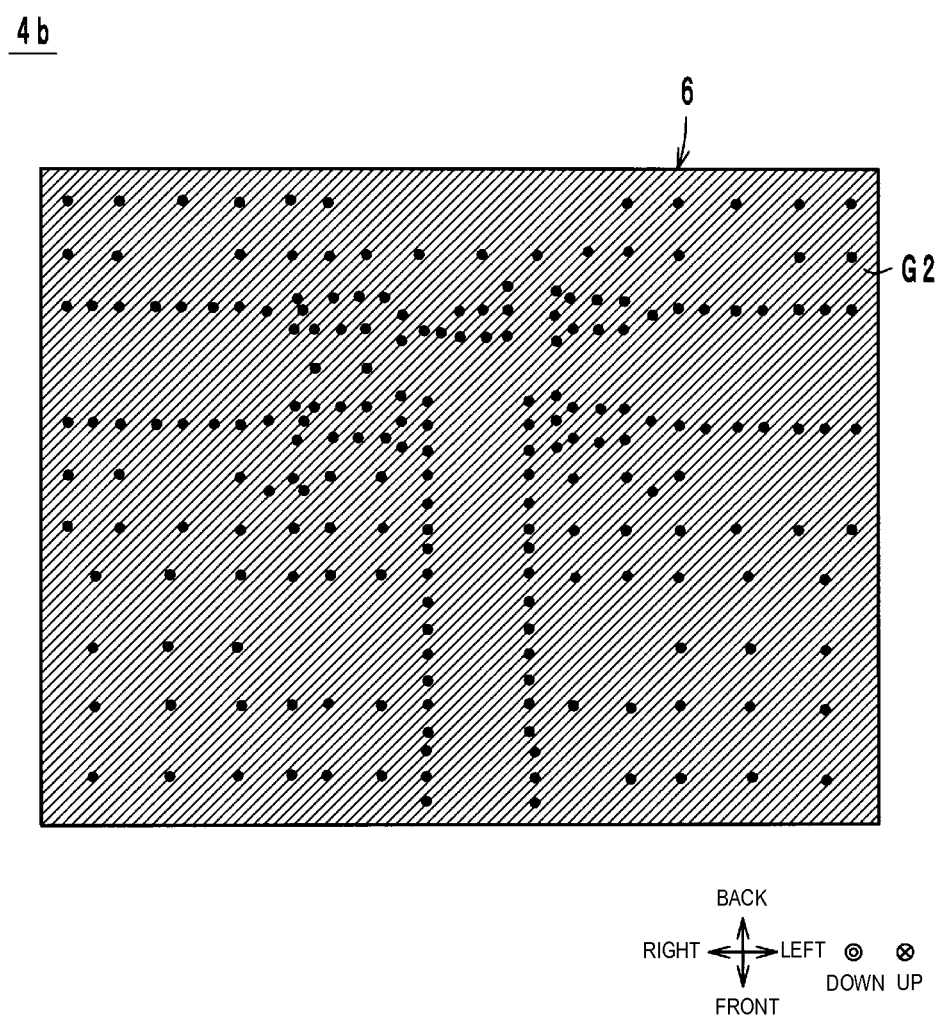
FIG. 18 is a plan view of the circuit substrate from below.
Figure 19:
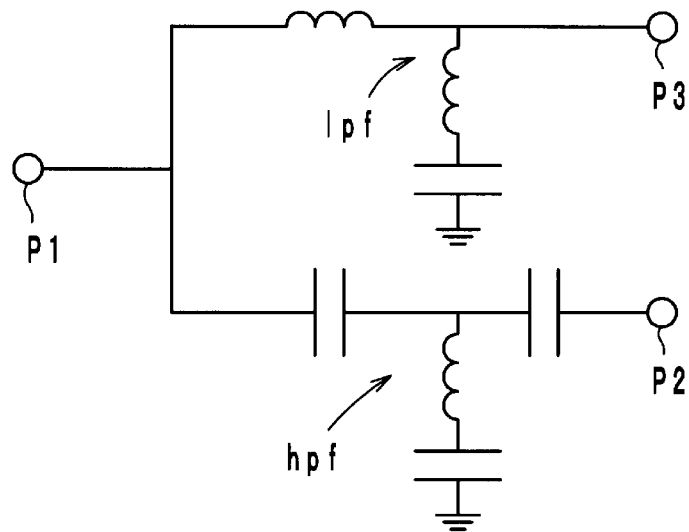
FIG. 19 illustrates a splitter described in Japanese Unexamined Patent Application Publication No. 2005-323064.

A circuit substrate and a branch circuit according to a modification of a preferred embodiment of the present invention will be described while referring to the drawings. FIG. 15 is an equivalent circuit diagram of a branch circuit 2b. FIG. 16 is a plan view of the branch circuit 2b from above. FIG. 17 is a plan view of a circuit substrate 4b from above. FIG. 18 is a plan view of the circuit substrate 4b from below. In FIGS. 15 to 18, a direction normal to a main surface of the circuit substrate 4b is defined as an up-down direction.

First, a circuit configuration of the branch circuit 2b will be described while referring to FIG. 15. The equivalent circuit of the branch circuit 2b is different from the equivalent circuit of the branch circuit 2 in that the resistor elements R2 and R3 and the inductor element L3 are not provided. The rest of the configuration of the equivalent circuit of the branch circuit 2b is preferably the same as that of the equivalent circuit of the branch circuit 2 and therefore description thereof will be omitted.

Next, configurations of the branch circuit 2b and the circuit substrate 4b will be described while referring to FIGS. 16 to 18. The branch circuit 2b includes the circuit substrate 4b, an input port P11, output ports P12 and P13, an input path I1, and output paths O1 and O2. In FIGS. 16 to 18, the input port P11 and the output ports P12 and P13 are not illustrated.

The circuit substrate 4b includes a substrate body 6, signal line conductors 10, 12e, 12f and 14e to 14g, land portions 16a to 16c and 18a to 18c, and ground conductors G1 and G2. The substrate body 6 is a plate-shaped or substantially plate-shaped member having a rectangular or substantially rectangular shape when viewed in plan from above. Hereafter, a main surface of the substrate body 6 on the upper side will be referred to as a top surface and a main surface of the substrate body 6 on the lower side will be referred to as a bottom surface.

The ground conductors G1 and G2 of the circuit substrate 4b are preferably the same as the ground conductors G1 and G2 of the circuit substrate 4 and therefore description thereof is omitted.

The signal line conductor 10 of the circuit substrate 4b is preferably the same as the signal line conductor 10 of the circuit substrate 4 and therefore detailed description thereof is omitted. In addition, two solder portions are provided in a line on the left and right of a back-side end portion of the signal line conductor 10 so that a chip component, which will be described later, is able to be mounted. The solder portions are formed preferably by applying solder onto the conductor and in FIG. 17 are illustrated by black shading.

The signal line conductors 12e and 12f are provided on the top surface of the substrate body 6 and are included in the output path O2. The ground conductor G1 is not provided around the peripheries of the signal line conductors 12e and 12f. In this way, coplanar waveguides are defined by the signal line conductors 12e and 12f and the ground conductor G1. In addition, the ground conductor G2 covers the entire bottom surface of the substrate body 6 and is therefore superposed with the signal line conductors 12e and 12f when viewed in plan from above. Thus, the signal line conductors 12e and 12f and the ground conductor G2 form coplanar waveguides including a ground on the bottom surface.

The signal line conductor 12e is positioned to the right of the back-side end portion of the signal line conductor 10 and is a line-shaped or substantially line-shaped conductor that extends in the left-right direction. Solder portions preferably are provided in three places, that is, on a left-side end portion of the signal line conductor 12e, on a right-side end portion of the signal line conductor 12e and in the center of the signal line conductor 12e. The solder portion provided on the right-side end portion of the signal line conductor 12e is the land portion 16a.

The signal line conductor 12f is positioned to the right of a right-side end portion of the signal line conductor 12e and is a line-shaped or substantially line-shaped conductor that extends in the left-right direction. A right-side end portion of the signal line conductor 12f is positioned at an edge of the substrate body 6 on the right side. A solder portion, which is the land portion 16c, is provided on a left-side end portion of the signal line conductor 12f.

The land portion 16b is a solder portion provided between the right-side end portion of the signal line conductor 12e and the left-side end portion of the signal line conductor 12f. The land portion 16b is formed preferably by applying solder onto the ground conductor G1. The land portions 16a to 16c are provided on the top surface of the substrate body 6 and are included in the output path O2. In addition, the land portions 16a to 16c are land portions on which the low pass filter LPF, which will be described later, is to be mounted.

The signal line conductors 14e to 14g are provided on the top surface of the substrate body 6 and are included in the output path O1. The ground conductor G1 is not provided around the peripheries of the signal line conductors 14e to 14g. In this way, coplanar waveguides are defined by the signal line conductors 14e to 14g and the ground conductor G1. In addition, the ground conductor G2 covers the entire bottom surface of the substrate body 6 and is therefore superposed with the signal line conductors 14e to 14g when viewed in plan from above. Thus, the signal line conductors 14e to 14g and the ground conductor G2 define coplanar waveguides including a ground on the bottom surface.

The signal line conductor 14e is positioned to the left of the back-side end portion of the signal line conductor 10 and is a line-shaped or substantially line-shaped conductor that extends in the left-right direction. Solder portions are preferably provided in three places, that is, on a right-side end portion of the signal line conductor 14e, on a left-side end portion of the signal line conductor 14e and in the center of the signal line conductor 14e. The solder portion provided on the left-side end portion of the signal line conductor 14e is the land portion 18a.

The signal line conductor 14f is positioned to the left of a left-side end portion of the signal line conductor 14e and is a line-shaped or substantially line-shaped conductor that extends in the left-right direction. A left-side end portion of the signal line conductor 14f is positioned at an edge of the substrate body 6 on the left side. A solder portion, which is the land portion 18c, is provided on a right-side end portion of the signal line conductor 14f.

The signal line conductor 14g is positioned behind the signal line conductor 14e and is a line-shaped or substantially line-shaped conductor that extends in the front-back direction. Solder portions are preferably provided in two places, that is, on a front-side end portion of the signal line conductor 14g and on a back-side end portion of the signal line conductor 14g. In addition, a solder portion is provided on the ground conductor G1 behind the back-side end portion of the signal line conductor 14g.

The land portion 18b is a solder portion provided between the left-side end portion of the signal line conductor 14e and the right-side end portion of the signal line conductor 14f. The land portion 18b is formed by applying solder onto the ground conductor G1.

As described above, roughly speaking, the signal line conductors 12e and 12f extend toward the right from the center of the substrate body 6. Roughly speaking, the signal line conductors 14e to 14g extend toward the left from the center of the substrate body 6. Thus, the signal line conductors 12e and 12f and the signal line conductors 14e to 14g have line-symmetrical or substantially line-symmetrical structures with respect to the signal line conductor 10.

The inductor element L2 illustrated in FIG. 16 is mounted on a right-side solder portion provided on the back-side end portion of the signal line conductor 10 and on a solder portion provided on the left-side end portion of the signal line conductor 12e. In other words, an upstream-side end portion (left-side end portion) of the signal line conductor 12e provided farthest upstream in a transmission direction of a high-frequency signal among the signal line conductors 12e and 12f is connected to the signal line conductor 10 via the inductor element L2, which is a lumped-parameter element. That is, it can be connected without using an unnecessary line conductor.

The capacitor element C2 illustrated in FIG. 15 is mounted on the solder portion provided in the center of the signal line conductor 12e and on the solder portion provided on the ground conductor G1 behind that solder portion. The low pass filter LPF is mounted on the land portions 16a to 16c.

The capacitor element C1 is mounted on the left-side solder portion provided on the back-side end portion of the signal line conductor 10 and on the solder portion provided on the right-side end portion of the signal line conductor 14e. In other words, an upstream-side end portion of the signal line conductor 14e (right-side end portion) provided farthest upstream in a transmission direction of a high-frequency signal among the signal line conductors 14e to 14g is connected to the signal line conductor 10 via the capacitor element C1, which is a lumped-parameter element. That is, it is connected without using an unnecessary line conductor.

The resistor element R1 is mounted on the solder portion provided in the center of the signal line conductor 14e and on the solder portion provided on the front-side end portion of the signal line conductor 14g. The inductor element L1 is mounted on the solder portion provided on the back-side end portion of the signal line conductor 14g and on the solder portion provided on the ground conductor G1 behind that solder portion. The high pass filter HPF is mounted on the land portions 18a to 18c.

The thus-configured branch circuit 2b and circuit substrate 4b are also able to exhibit the same effect as the branch circuit 2 and the circuit substrate 4.

Other Preferred Embodiments

Branch circuits and circuit substrates according to the present invention are not limited to the branch circuits 2, 2a and 2b and the circuit substrates 4, 4a and 4b and may be modified within the spirit of the present invention.

In addition, the configurations of the branch circuits 2, 2a and 2b and the circuit substrates 4, 4a and 4b may be appropriately combined.

Furthermore, the branch circuits 2, 2a and 2b and the circuit substrates 4, 4a and 4b include two output paths O1 and O2, but may instead include three or more output paths, for example.

The ground conductor G2 is provided on the bottom surface of the substrate body 6, but may instead be provided inside the substrate body 6.

In addition, in the branch circuits 2 and 2a and the circuit substrates 4 and 4a, an upstream-side end portion of the signal line conductor 14a provided farthest upstream in a transmission direction of a high-frequency signal among the signal line conductors 14a to 14d need not be connected to the signal line conductor 10 via the capacitor element C1, which is a lumped-parameter element. That is, the signal line conductor 14a may be directly connected to the signal line conductor 10. Similarly, in the branch circuit 2b and the circuit substrate 4b, an upstream-side end portion of the signal line conductor 14e provided farthest upstream in a transmission direction of a high-frequency signal among the signal line conductors 14e to 14g need not be connected to the signal line conductor 10 via the capacitor element C1, which is a lumped-parameter element. That is, the signal line conductor 14e may be directly connected to the signal line conductor 10.

In addition, the capacitor element C1, which connects the upstream-side end portion of the signal line conductor 14a provided farthest upstream in a transmission direction of a high-frequency signal among the signal line conductors 14a to 14d and the signal line conductor 10, may define a portion of the high pass filter HPF instead of defining a portion of the matching circuit MC1.

Furthermore, the high pass filter HPF and the low pass filter LPF may be each defined by a plurality of chip components rather just one chip component.

In the branch circuits 2, 2a and 2b and the circuit substrates 4, 4a and 4b, it is preferable that the winding axis of the inductor element L1 and the winding axis of an inductor included in the high pass filter HPF be perpendicular or substantially perpendicular to each other. For example, it is preferable that the winding axis of the inductor element L1 extend in the front-back direction and that the winding axis of an inductor included in the high pass filter HPF extend in the left-right direction. In this way, magnetic field coupling between the inductor element L1 and the inductor included in the high pass filter HPF is significantly reduced or prevented.

In the branch circuits 2, 2a and 2b and the circuit substrates 4, 4a and 4b, the signal line conductors 10, 12a to 12f and 14a to 14g preferably include conductor layers provided on the top surface of the substrate body 6, but they may include conductor layers provided inside the substrate body 6.

In the branch circuits 2 and 2a and the circuit substrates 4 and 4a, the capacitor element C1 may be connected to a portion of the signal line conductor 14a other than the upstream-side portion. Similarly, in the branch circuit 2b and the circuit substrate 4b, the capacitor element C1 may be connected to a portion of the signal line conductor 14e other than the upstream-side portion.

In addition, in the branch circuits 2 and 2a and the circuit substrates 4 and 4a, the inductor element L2 may be connected to a portion of the signal line conductor 12a other than the upstream-side portion. Similarly, in the branch circuit 2b and the circuit substrate 4b, the inductor element L2 may be connected to a portion of the signal line conductor 12e other than the upstream-side portion.

In addition, in the branch circuits 2 and 2a and the circuit substrates 4 and 4a, the signal line conductors 10, 12a to 12f and 14a to 14g may define a microstripline structure.

Furthermore, in the branch circuits 2 and 2a and the circuit substrates 4 and 4a, other passive elements such as capacitor elements or inductor elements may be provided instead of the resistor elements R1 to R3.

In addition, in the branch circuits 2 and 2a and the circuit substrates 4 and 4a, the positional relationship between the output path O1 and the output path O2 may be reversed.

Preferred embodiments of the present invention are applicable to branch circuits and circuit substrates and are particularly excellent in that generation of loss is significantly reduced or prevented.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A circuit substrate for use in a branch circuit that includes an input path, a first output path including a high pass filter and connected to the input path, and a second output path including a low pass filter and connected to the input path, the circuit substrate comprising:
    a substrate body;
    an input signal line conductor with which the substrate body is provided and which is included in the input path;
    a first mounting portion provided on a main surface of the substrate body, included in the first output path and on which the high pass filter is mounted;
    at least one first output signal line conductor with which the substrate body is provided and which is included in the first output path; and
    a second mounting portion provided on the main surface of the substrate body, included in the second output path and on which the low pass filter is mounted; wherein
    the first output signal line conductor provided farthest upstream in a propagation direction of a signal is connected to the input signal line conductor via a first lumped-parameter element mounted on the main surface of the substrate body; and
    the first lumped-parameter element is included in only the first output path between the high pass filter and the input signal line conductor and is not included in the second output path.

2. The circuit substrate according to claim 1, wherein the first output path includes a first matching circuit including the first lumped-parameter element.

3. The circuit substrate according to claim 2, wherein the first matching circuit includes an inductor element, wherein the high pass filter includes an inductor; and
    a winding axis of the inductor element and a winding axis of an inductor are perpendicular or substantially perpendicular to each other.

4. The circuit substrate according to claim 1, further comprising:
    at least one second output signal line conductor with which the substrate body is provided and which is included in the second output path; wherein
    the second output signal line conductor provided farthest upstream in a propagation direction of a signal is connected to the input signal line conductor via a second lumped-parameter element mounted on the main surface of the substrate body.

5. The circuit substrate according to claim 4, wherein the second output path includes a second matching circuit including the second lumped-parameter element.

6. The circuit substrate according to claim 5, further comprising:
    a first ground conductor provided on the main surface of the substrate body and maintained at a ground potential; and
    the second matching circuit connected to the first ground conductor at a point closer to the high pass filter than to the low pass filter.

7. The circuit substrate according to claim 4, wherein the first output signal line conductor and the second output signal line conductor have asymmetrical structures with respect to the input signal line conductor.

8. The circuit substrate according to claim 1, further comprising a first ground conductor provided on the main surface of the substrate body and maintained at a ground potential, the input signal line conductor defining a coplanar waveguide together with the first ground conductor.

9. The circuit substrate according to claim 1, further comprising a second ground conductor with which the substrate body is provided and which is superposed with the input signal line conductor when viewed in plan from a direction normal to the main surface of the substrate body.

10. A branch circuit comprising:
    the circuit substrate according to claim 1;
    the high pass filter mounted on the first mounting portion; and
    the low pass filter mounted on the second mounting portion.

11. The circuit substrate according to claim 2, further comprising:
    at least one second output signal line conductor with which the substrate body is provided and which is included in the second output path; wherein
    the second output signal line conductor located farthest upstream in a propagation direction of a signal is connected to the input signal line conductor via a second lumped-parameter element mounted on the main surface of the substrate body.

12. The circuit substrate according to claim 3, further comprising:
    at least one second output signal line conductor with which the substrate body is provided and which is included in the second output path; wherein
    the second output signal line conductor located farthest upstream in a propagation direction of a signal is connected to the input signal line conductor via a second lumped-parameter element mounted on the main surface of the substrate body.

13. The circuit substrate according to claim 5, wherein the first output signal line conductor and the at least one second output signal line conductor have asymmetrical structures with respect to the input signal line conductor.

14. The circuit substrate according to claim 6, wherein the first output signal line conductor and the at least one second output signal line conductor have asymmetrical structures with respect to the input signal line conductor.

15. The circuit substrate according to claim 2, further comprising a ground conductor provided on the main surface of the substrate body and maintained at a ground potential, the input signal line conductor defining a coplanar waveguide together with the ground conductor.

16. The circuit substrate according to claim 3, further comprising a ground conductor provided on the main surface of the substrate body and maintained at a ground potential, the input signal line conductor defining a coplanar waveguide together with the ground conductor.

17. The circuit substrate according to claim 4, further comprising a ground conductor provided on the main surface of the substrate body and maintained at a ground potential, the input signal line conductor defining a coplanar waveguide together with the ground conductor.

18. The circuit substrate according to claim 5, further comprising a ground conductor provided on the main surface of the substrate body and maintained at a ground potential, the input signal line conductor defining a coplanar waveguide together with the ground conductor.

19. The circuit substrate according to claim 6, further comprising a ground conductor provided on the main surface of the substrate body and maintained at a ground potential, the input signal line conductor defining a coplanar waveguide together with the ground conductor.

20. The circuit substrate according to claim 7, further comprising a ground conductor provided on the main surface of the substrate body and maintained at a ground potential, the input signal line conductor defining a coplanar waveguide together with the ground conductor.

* * * * *